(12) United States Patent
Zhang et al.

(10) Patent No.: US 9,640,609 B2
(45) Date of Patent: May 2, 2017

(54) DOUBLE GUARD RING EDGE TERMINATION FOR SILICON CARBIDE DEVICES

(75) Inventors: Qingchun Zhang, Cary, NC (US); Charlotte Jonas, Morrisville, NC (US); Anant K. Agarwal, Chapel Hill, NC (US)

(73) Assignee: Cree, Inc., Durham, NC (US)

(*) Notice: Subject to any disclaimer, the term of this patent is extended or adjusted under 35 U.S.C. 154(b) by 385 days.

(21) Appl. No.: 12/037,211

(22) Filed: Feb. 26, 2008

(65) Prior Publication Data

US 2009/0212301 A1  Aug. 27, 2009

(51) Int. Cl.
H01L 31/0312 (2006.01)
H01L 29/06 (2006.01)
H01L 29/16 (2006.01)
H01L 29/872 (2006.01)

(52) U.S. Cl.
CPC ........ *H01L 29/0619* (2013.01); *H01L 29/063* (2013.01); *H01L 29/1608* (2013.01); *H01L 29/872* (2013.01)

(58) Field of Classification Search
CPC ............... H01L 29/0619; H01L 29/063; H01L 29/1608; H01L 29/872
USPC ............................ 257/77, 127, 483–484, 620
See application file for complete search history.

(56) References Cited

U.S. PATENT DOCUMENTS

| | | | |
|---|---|---|---|
| 4,242,690 A | 12/1980 | Temple | |
| 4,742,377 A * | 5/1988 | Einthoven | 257/484 |
| 4,927,772 A | 5/1990 | Arthur et al. | |
| 5,233,209 A * | 8/1993 | Rodgers et al. | 257/171 |
| 5,726,469 A | 3/1998 | Chen | |
| 5,804,483 A | 9/1998 | Harris | |
| 5,914,500 A | 6/1999 | Bakowski et al. | |
| 5,967,795 A | 10/1999 | Bakowsky et al. | |
| 5,977,605 A | 11/1999 | Bakowsky et al. | |
| 6,083,814 A | 7/2000 | Nilsson | |
| 6,696,705 B1 | 2/2004 | Barthelmess et al. | |
| 6,696,728 B2 | 2/2004 | Onishi et al. | |
| 7,026,650 B2 | 4/2006 | Ryu et al. | |
| 7,144,797 B2 | 12/2006 | Chow et al. | |
| 7,304,363 B1 | 12/2007 | Shah | |
| 7,649,213 B2 * | 1/2010 | Hatakeyama et al. | 257/127 |
| 7,838,377 B2 | 11/2010 | Zhang et al. | |

(Continued)

FOREIGN PATENT DOCUMENTS

| | | |
|---|---|---|
| CN | 1124408 A | 6/1996 |
| CN | 1745479 A | 3/2006 |

(Continued)

OTHER PUBLICATIONS

International Search Report and Written Opinion, International Application No. PCT/US2009/000734, Apr. 23, 2009.

(Continued)

*Primary Examiner* — Ori Nadav
(74) *Attorney, Agent, or Firm* — Myers Bigel, P.A.

(57) ABSTRACT

Edge termination structures for semiconductor devices are provided including a plurality of spaced apart concentric floating guard rings in a semiconductor layer that at least partially surround a semiconductor junction. The spaced apart concentric floating guard rings have a highly doped portion and a lightly doped portion. Related methods of fabricating devices are also provided herein.

28 Claims, 15 Drawing Sheets

(56) References Cited

U.S. PATENT DOCUMENTS

| | | | |
|---|---|---|---|
| 7,875,946 B2* | 1/2011 | Yasuoka et al. | 257/438 |
| 2005/0205872 A1 | 9/2005 | Hallin et al. | |
| 2006/0065899 A1 | 3/2006 | Hatakeyama et al. | |
| 2006/0068571 A1 | 3/2006 | Chow et al. | |
| 2006/0118900 A1 | 6/2006 | Zeghbroeck | |
| 2006/0273346 A1 | 12/2006 | Pfirsch | |
| 2007/0001230 A1 | 1/2007 | Lee et al. | |
| 2007/0120148 A1 | 5/2007 | Nogome | |
| 2007/0241427 A1 | 10/2007 | Mochizuki et al. | |
| 2008/0001158 A1 | 1/2008 | Das et al. | |
| 2008/0006848 A1 | 1/2008 | Chen et al. | |
| 2008/0105949 A1 | 5/2008 | Zhang et al. | |
| 2009/0212301 A1 | 8/2009 | Zhang et al. | |
| 2010/0032685 A1 | 2/2010 | Zhang et al. | |
| 2010/0289032 A1 | 11/2010 | Zhang et al. | |

FOREIGN PATENT DOCUMENTS

| | | |
|---|---|---|
| CN | 1941366 A | 4/2007 |
| DE | 10 2004 045768 A1 | 4/2006 |
| EP | 0 176 778 A2 | 4/1986 |
| EP | 0 389 863 A1 | 10/1990 |
| EP | 1 806 787 A1 | 7/2007 |
| JP | A-55-006887 | 1/1980 |
| JP | 02-294026 | 12/1990 |
| JP | 03-094469 | 4/1991 |
| JP | 3-225870 | 10/1991 |
| JP | 4-092434 A | 3/1992 |
| JP | 9162422 A | 6/1997 |
| JP | 3068838 | 7/2000 |
| JP | 2000-516767 A | 12/2000 |
| JP | 2001-035857 A | 2/2001 |
| JP | 2001-196604 | 7/2001 |
| JP | 2001196604 A | 7/2001 |
| JP | 2006-100593 | 4/2006 |
| JP | 2006-196652 | 7/2006 |
| JP | 2006-516815 | 7/2006 |
| JP | 2007-096006 | 4/2007 |
| JP | 2007-115875 | 5/2007 |
| JP | 2007-165604 | 6/2007 |
| JP | 2007-173841 | 7/2007 |
| JP | 2009-44177 | 2/2009 |
| JP | 2009-164486 | 7/2009 |
| WO | WO 96/03774 | 2/1996 |
| WO | WO 97/08754 | 3/1997 |
| WO | WO97/08754 | 3/1997 |
| WO | WO 98/02924 | 1/1998 |
| WO | WO 98/02924 A2 | 1/1998 |
| WO | WO 98/32178 A1 | 7/1998 |
| WO | WO 2004/066392 A1 | 8/2004 |
| WO | WO 2006/135031 A2 | 12/2006 |
| WO | WO 2006/135031 A3 | 12/2006 |
| WO | WO 2007/040710 A1 | 4/2007 |

OTHER PUBLICATIONS

Singh et al., "Planar Terminations in 4H-SiC Schottky Diodes with Low Leakage and High Yields," ISPSD '97, pp. 157-160.
Ueno et al., "The Guard-Ring Termination for High-Voltage SiC Schottky Barrier Diodes," IEEE Electron Device Letters, vol. 16, No. 7, Jul. 1995, pp. 331-332.
Kinoshita et al., "Guard Ring Assisted RESURF: A New Termination Structure Providing Stable and High Breakdown Voltage for SiC Power Devices," Tech. Digest of ISPSD '02, pp. 253-256.
Yilmaz, "Optimization and Surface Charge Sensitivity of High Voltage Blocking Structures with Shallow Junctions," IEEE Transactions on Electron Devices, vol. 38, No. 3, Jul. 1991, pp. 1666-1675.
Asano et al., "Dynamic Characteristics of 6.2kV High Voltage 4H-SiC pn Diode with Low Loss", Transactions of the Institute of Electrical Engineers of Japan, Part D Inst. Electr. Eng. Japan, vol. 123D, No. 5, May 2003, pp. 623-627, XP8124184.
European Search Report for corresponding EP patent application No. 09163424.6 dated Apr. 9, 2010.
International Search Report and Written Opinion (13 pages) corresponding to International Application No. PCT/US2008/010538; Mailing Date: Dec. 22, 2008.
Losee et al., "High Voltage 4H-SiC PiN rectifiers with single-implant, multi-zone JTE termination", Power Semiconductor Devices and ICS, 2004; Proceedings ISPSD 2004; The 16$^{th}$ International Symposium on Kitakyushu Int. Conf. Ctr. Japan, May 24-27, 2004; Piscataway, NJ, USA, IEEE, May 24, 2004, pp. 301-304, XP010723398.
Notification of Transmittal of the International Search Report and the Written Opinion of the International Searching Authority, or the Declaration; International Search Report; Written Opinion of the International Searching Authority—Corresponding to International Application No. PCT/US2010/026632; Date of Mailing: Oct. 8, 2010; 16 pages.
Stengl et al., "Variation of Lateral Doping—A New Concept to Avoid High Voltage Breakdown of Planar Junctions", International Electron Devices Meeting; Washington, Dec. 1-4, 1985; pp. 154-157, XP002013050.
Stengl et al., Variation of Lateral Doping as a Field Terminator for High-Voltage Power Devices, IEEE Transactions on Electron Devices; vol. ED-33, No. 3, Mar. 1986, pp. 426-428, XP000836911.
Sundaresan et al., "Ultra-low resistivity Al+ implanted 4H-SiC obtained by microwave annealing and a protective graphite cap", Solid-State Electronics vol. 52, 2008, pp. 140-145, XP022360431.
Vassilevski et al., "High Voltage Silicon Carbide Schottky Diodes with Single Zone Junction Termination Extension", Materials Science Forum, 2007 Trans Tech Publications, vols. 556-557 (2007) pp. 873-876, XP8124186.
International Preliminary Report on Patentability Corresponding to International Application No. PCT/US2010/026632; Date of Mailing: Jun. 10, 2011; 15 pages.
Notification of Transmittal of the International Search Report and the Written Opinion of the International Searching Authority, PCT/US2012/023263, Aug. 6, 2012.
Official Action, Japanese Patent Application No. 2010-533058, Nov. 9, 2012.
Official Action, Japanese Patent Application No. 2010-548670, Dec. 14, 2012.
Gao Y. et al., "Investigation of boron diffusion in 6H-SiC", Applied Physics Letters, vol. 83, No. 5, Aug. 4, 2003, pp. 905-907.
Gao, Y. et al., "Selective doping of 4H-SiC by codiffusion of aluminum and boron", Journal of Applied Physics, vol. 90, No. 11, Dec. 1, 2001, pp. 5647-5651.
Grekhov, I.V. et al., "High-Voltage (900 V) 4H-SiC Schottky Diodes with a Boron-Implanted guard p-n Junction", Semiconductors, vol. 42, No. 2, 2008, pp. 211-214.
Merrett, J.N. et al., "Fabrication of Self-Aligned Graded Junction Termination Extensions with Applications to 4H-SiC P-N Diodes", Journal of Electronic Materials, vol. 31, No. 6, 2002, pp. 635-639.
Solmi, S. et al., "High-concentration boron diffusion in silicon: Simulation of the precipitation phenomena", Journal of Applied Physics, vol. 68, No. 7, Oct. 1, 1990, pp. 3250-3258.
Soloviev, S. I. et al., "Doping of 6H-SiC by selective diffusion of boron", Applied Physics Letters, vol. 77, No. 24, Dec. 11, 2000, pp. 4004-4006.
Notification of the First Office Action, Chinese Patent Application No. 200980111322.0, Apr. 28, 2012, 10 pages.
Official Action, Japanese Patent Application No. 2009-186765, May 8, 2012, 4 pages.
Communication pursuant to Article 94(3)EPC, European Patent Application No. 09 713 922.4, Jan. 13, 2012, 5 pages.
Notification Concerning Transmittal of International Preliminary Report on Patentability, PCT/US2012/023263, Aug. 22, 2013.
Communication pursuant to Article 94(3) EPC, European Patent Appiication No. 08846287.4, Jun. 20, 2013.
Office Action, Chinese Application No. 201080032441.X, Nov. 4, 2013.
Office Action, Japanese Application No. 2012-510804, Nov. 5, 2013.

(56) References Cited

OTHER PUBLICATIONS

Notice of Preliminary Rejection, Korean Application No. 10-2010-7010197, Jul. 2, 2014, 9 pages.
KIPO's Notice of Preliminary Rejection, Korean Patent Application No. 10-2010-7021354, Issued Feb. 9, 2014, 10 pages.
KIPO's Notice of Preliminary Rejection, Korean Patent Application No. 10-2011-7028952, Issued Nov. 4, 2015, 19 pages.
Office Action of the Intellectual Property Office, ROC (Taiwan) Patent Application No. 101104463; Issued Dec. 27, 2014, 12 pages.
Notification of Reasons for Rejection, JP Patent Application No. 2013-553461, Sep. 25, 2014, 4 pages.

* cited by examiner

X-field

Y-field

Y-field

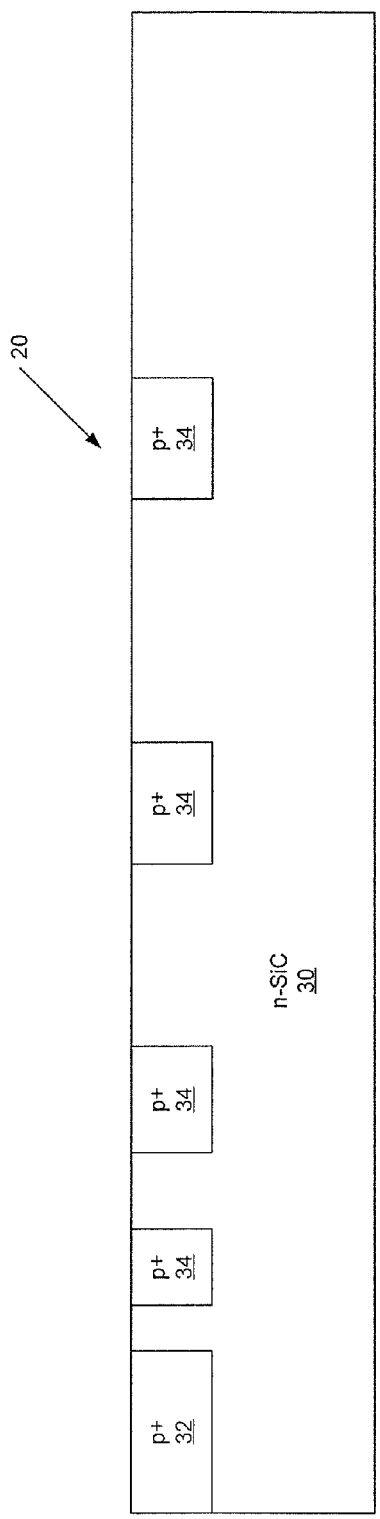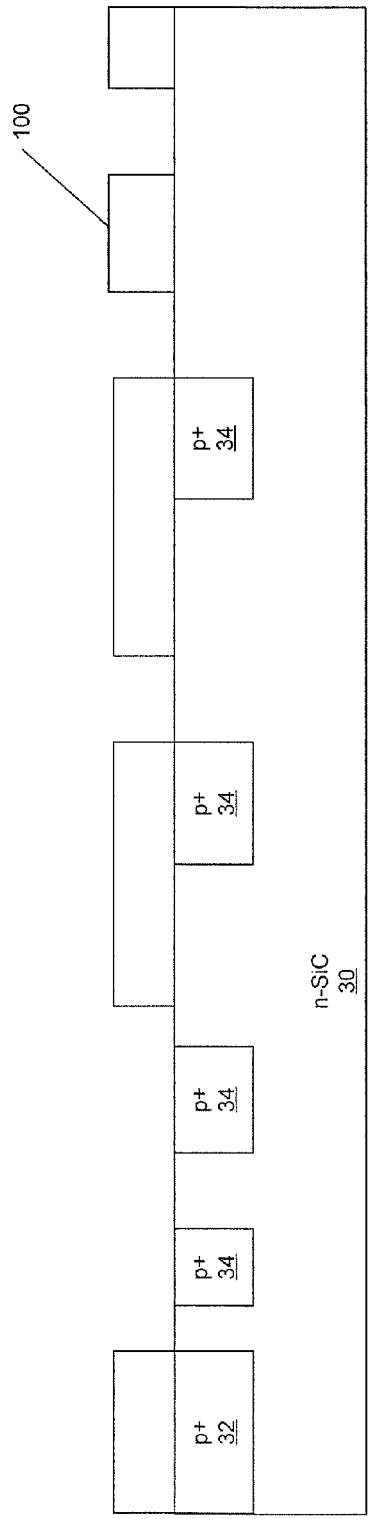
Figure 4A
Figure 4B

DOUBLE GUARD RING EDGE TERMINATION FOR SILICON CARBIDE DEVICES

FIELD OF THE INVENTION

The present invention relates microelectronic devices and more particularly to edge termination for silicon carbide devices.

BACKGROUND OF THE INVENTION

High voltage silicon carbide (SiC) Schottky diodes, which can handle voltages between, for example, about 600V and about 2.5 kV, are expected to compete with silicon PIN diodes fabricated with similar voltage ratings. Such diodes may handle as much as about 100 amps or more of current, depending on their active area. High voltage Schottky diodes have a number of important applications, particularly in the field of power conditioning, distribution and control.

An important characteristic of a SiC Schottky diode in such applications is its switching speed. Silicon-based PIN devices typically exhibit relatively poor switching speeds. A silicon PIN diode may have a maximum switching speed of approximately 20 kHz, depending on its voltage rating. In contrast, silicon carbide-based devices are theoretically capable of much higher switching speeds, for example, in excess of about 100 times better than silicon. In addition, silicon carbide devices may be capable of handling a higher current density than silicon devices.

A conventional SiC Schottky diode structure has an n-type SiC substrate on which an n⁻ epitaxial layer, which functions as a drift region, is formed. The device typically includes a Schottky contact formed directly on the n⁻ layer. Surrounding the Schottky contact is a p-type JTE (junction termination extension) region that is typically formed by ion implantation. The implants may be aluminum, boron, or any other suitable p-type dopant. The purpose of the JTE region is to reduce or prevent the electric field crowding at the edges, and to reduce or prevent the depletion region from interacting with the surface of the device. Surface effects may cause the depletion region to spread unevenly, which may adversely affect the breakdown voltage of the device. Other termination techniques include guard rings and floating field rings that may be more strongly influenced by surface effects. A channel stop region may also be formed by implantation of n-type dopants such as Nitrogen or Phosphorus in order to prevent the depletion region from extending to the edge of the device.

Additional conventional terminations of SiC Schottky diodes are described in "Planar Terminations in 4H-SiC Schottky Diodes With Low Leakage And High Yields" by Singh et al., ISPSD '97, pp. 157-160. A p-type epitaxy guard ring termination for a SiC Schottky Barrier Diode is described in "The Guard-Ring Termination for High-Voltage SiC Schottky Barrier Diodes" by Ueno et al., IEEE Electron Device Letters, Vol. 16, No. 7, July, 1995, pp. 331-332. Additionally, other termination techniques are described in published PCT Application No. WO 97/08754 entitled "SiC Semiconductor Device Comprising A PN Junction With A Voltage Absorbing Edge."

As briefly discussed above, junction termination extension (JTE), multiple floating guard rings (MFGR) and field plates (FP) are commonly used termination schemes in high voltage silicon carbide devices. JTE may be a very effective edge termination, however JTE may also require tight control of the product of the active doping concentration and junction depth. Furthermore, additional fabrication costs may be incurred as a result of added photolithography and implantation steps.

FP is also a conventional technique for edge termination of a device and may be cost-effective. In conventional FP devices, high fields are supported by the oxide layer under the metal field plate. This technique performs well for silicon devices where the highest field in the semiconductor is relatively low. However, in SiC devices the electric fields in the blocking state may be very high (~2 MV/cm) which multiplies by a factor of 2.5 at the oxide-semiconductor interface. This leads to very high oxide fields and may result in long-term reliability problems. Thus, FP may be unsuitable for use in SiC devices.

Multiple floating guard rings in addition to JTE has been proposed as a technique for reducing the sensitivity of the JTE to implant dose variation. See Kinoshita et al., "Guard Ring Assisted RESURF: A New Termination Structure Providing Stable and High Breakdown Voltage for SiC Power Devices," *Tech. Digest of ISPSD* '02, pp. 253-256. Kinoshita et al. reported that such techniques reduced the sensitivity to implant dose variation. However, the area utilized for termination was increased to almost three times the area of JTE alone as the guard rings are added to both the inner edge of the JTE and the outside of the JTE.

MFGR may also be a cost-effective method of edge termination because it may use fewer fabrication steps than JTE. However, MFGR may be very sensitive to surface charges in the oxide-semiconductor interface. The ideal electric field profile of an ideal Multiple Floating Guard Rings (MFGR) termination is shown in FIGS. 1A through 1D. FIG. 1A illustrates a conventional MFGR device where the spacing between the p-type SiC guard rings is illustrated as constant for simplicity. At the blocking state, the depletion region starts at the main junction and expands both laterally and vertically. Once the depletion region punches through to the first guard ring, the potential of the first guard ring gets pinned to that of the main junction. At this point, the punch-through side of the guard ring injects a small amount of holes into the n-region. This lost charge is replaced by the depletion of the n charge from the outer edge of the guard ring. This punch-through and charge injection continues on until the depletion region reaches the final guard ring. Since the amounts of n-charge depleted between the guard rings are the same (constant spacing MFGR's), the peak x-field each guard ring sees is the same for all guard rings, as shown in FIG. 1B. However, as seen in FIG. 1C, the peak y-field is different for all guard rings because the amount of n-charge depletion is different for all guard rings. The highest y-field value is present at the main junction and successive guard rings have reduced levels of y-field. The vector sum of the x and the y fields is illustrated in FIG. 1D, and shows the highest electric field at the bottom corner of the main junction (circled in FIG. 1A). Therefore, breakdown is expected to happen at the circled bottom edge of the main junction if equally spaced MFGR termination is used. If it is desired that each floating guard ring supports the same electric fields, the spacing between the guard rings may vary. The spacing between the main junction and the inner-most guard ring may be the smallest, and the spacing at the outer-most guarding may be the largest.

One potentially critical issue with the MFGR termination scheme is that it is very sensitive to the charge at the oxide-semiconductor interface. The net charge at metal-oxide-semiconductor (MOS) gate regions of MOS transistors can be very low. However, field oxides often typically have lower quality when compared to thermally grown gate oxides and plasma processing steps may result in higher oxide charges. When a large amount of positive charge is present at the oxide-semiconductor interface, the surface of the lightly doped n-layer turns into n⁺ regions, which compresses the equi-potential lines. This results in a very high field at the oxide-semiconductor interface and, therefore, reduces the effectiveness of the floating guard rings that may result in a reduction of blocking voltage for the devices. In addition, this charge, mostly positive, can move towards or away from the oxide-semiconductor interface, causing time dependent breakdown voltage, or breakdown walk-out. Breakdown walk-out refers to a phenomenon where the breakdown voltage starts at a first value and increases with time and bias. This problem may be even greater in silicon carbide devices because the field oxides are generally deposited. Deposited oxides, typically, have inferior characteristics to those of thermally grown layers, and the oxide-semiconductor interface in a silicon carbide device has much greater charge density compared to that of a silicon device.

Putting Offset Field Plates on each guard ring was suggested in Yilmaz, "Optimization and Surface Charge Sensitivity of High Voltage Blocking Structures with Shallow Junctions," *IEEE Transactions on Electron Devices*, Vol. 38, No. 3, July 1991, pp. 1666-1675. Such a structure is illustrated in FIG. 2. As seen in FIG. 2, an n-type semiconductor layer 10 has a main junction 12 and a series of floating guard rings 14 formed therein. An oxide layer 16 is provided on the semiconductor layer 10 and openings are provided in the oxide layer 16. The offset field plates 18 are provided in the openings to contact the floating guard rings 14 and to extend onto the oxide layer 16.

Yilmaz demonstrated that the voltage that each guard ring supports can be distributed evenly and the sensitivity to parasitic charges can be reduced by spreading the equipotential lines near the interface. This technique can be implemented in silicon devices relatively easily because the doping densities of the drift layer in silicon devices are generally low, and guard rings can have reasonably large spacing between them. However, in silicon carbide devices, the doping densities in the drift layer can be up to 100 times or more than that of a silicon device with the same blocking capability and the electric field each guard ring supports may be up to 10 times or more greater than that of a silicon device. Therefore, the guard rings may need to be placed much closer to each other compared to a silicon device, and the field oxide thickness that may be needed may be much thicker than that used in silicon devices. Such requirements may be difficult to achieve with conventional fabrication techniques, such as photolithography, for silicon carbide devices because the Offset Field Plate-Floating Guard Ring structure has each field plate contacting each guard ring separately and the edge of the guard ring should not overlap with the edge of the next guard ring. To meet these requirements, each guard ring may need to be enlarged, and the alignment tolerance of the guard rings should be less than 0.25 µm. Such alignment requirements may be difficult, if not impossible, to achieve with conventional contact aligners for SiC. Step coverage may also be another issue with the Offset Field Plate-Floating Guard Ring structure because the thickness of the oxide that may be needed. Additionally, in field plate designs the quality of the oxide may be important in achieving acceptable results as it is the oxide that supports the field or voltages. Oxides in silicon carbide devices, generally have lower quality than that available in silicon devices. Accordingly, the Offset Field Plate-Floating Guard Ring structure may not be practical for silicon carbide devices.

Guard ring edge termination structures suitable for use in silicon carbide devices are discussed in commonly assigned U.S. Pat. No. 7,026,650 issued on Apr. 11, 2006 to Ryu et al. entitled Multiple floating guard ring edge termination for silicon carbide devices, the disclosure of which is hereby incorporated herein by reference in its entirety. As discussed therein, a surface charge compensation layer, such as a thin p-type layer, is provided in addition to the multiple floating guard rings. The surface charge compensation layer may be used to at least partially neutralize the effects of charges at oxide-semiconductor interfaces in the silicon carbide devices.

SUMMARY OF THE INVENTION

Some embodiments of the present invention provide edge termination structures for semiconductor devices including a plurality of spaced apart concentric floating guard rings in a semiconductor layer that at least partially surround a semiconductor junction. The spaced apart concentric floating guard rings have a highly doped portion and a lightly doped portion. In certain embodiments, the semiconductor device may be a silicon carbide semiconductor device, the semiconductor layer may be a silicon carbide layer and the semiconductor junction may be a silicon carbide-based semiconductor junction.

In further embodiments of the present invention, the highly doped portion of the floating guard rings extend a first distance into the silicon carbide layer and the lightly doped portion of the floating guard rings extend a second distance into the silicon carbide layer.

In still further embodiments of the present invention, the first and second distances may be the same.

In some embodiments of the present invention, the first distance may be less than the second distance. The first distance may be about 0.5 µm and the second distance is about 0.8 µm. The lightly doped portion of the floating guard rings may have a first doping concentration in a portion adjacent the highly doped portion of the floating guard rings and a second doping concentration, greater than the first doping concentration, beneath the highly doped portion of the floating guard rings. The first doping concentration may be about $1.0 \times 10^{17}$ and the second doping concentration may be about $1.4 \times 10^{17}$. The second doping concentration may be retrograde profile toward the $SiO_2/SiC$ interface.

In further embodiments of the present invention, the highly doped portion of the floating guard rings may have a dopant concentration of from about $5.0 \times 10^{18}$ cm$^{-3}$ to about $1.0 \times 10^{20}$ cm$^{-3}$ and the lightly doped portions of the floating guard rings may have a dopant concentration of from about $5.0 \times 10^{16}$ cm$^{-3}$ to about $5.0 \times 10^{17}$ cm$^{-3}$.

In still further embodiments of the present invention, the dopant concentrations may decrease from a main junction of the device to a periphery of the device. In particular embodiments, the dopant concentration of the lightly doped portion of the guard rings may decrease from the main junction of the device to the periphery of the device providing a gradient in the lightly doped portions of the guard rings.

In some embodiments of the present invention, the highly doped portions and the lightly doped portions extend a distance of from about 0.3 µm to about 0.8 µm into the silicon carbide layer.

In further embodiments of the present invention, the floating guard rings may be uniformly spaced, non-uniformly spaced and/or combinations of uniformly and non-uniformly spaced.

In still further embodiments of the present invention, the plurality of floating guard rings may include from about 2 to about 100 guard rings.

In some embodiments of the present invention, the silicon carbide layer may be an n-type silicon carbide layer and the plurality of spaced apart guard rings may be p-type silicon carbide.

In further embodiments of the present invention, the silicon carbide layer may be a p-type silicon carbide layer and the plurality of spaced apart guard rings may be n-type silicon carbide.

DESCRIPTION OF THE DRAWINGS

FIGS. 4A through 4D are cross sections illustrating processing steps in the fabrication of edge termination structures according to some embodiments of the present invention.

DETAILED DESCRIPTION

Figure 1A:
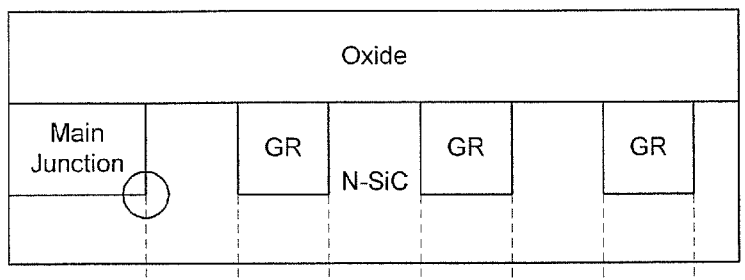
FIG. 1 is a diagram of a conventional MFGR structure and the ideal field profile of that structure.
Figure 1B:
Figure 1C:
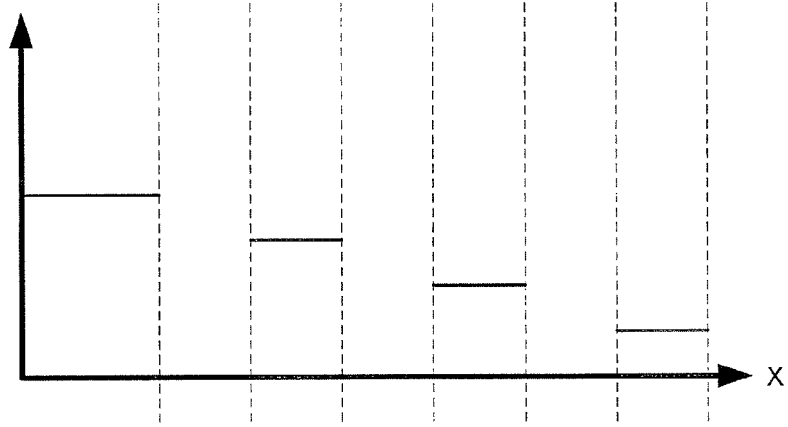
Figure 1D:
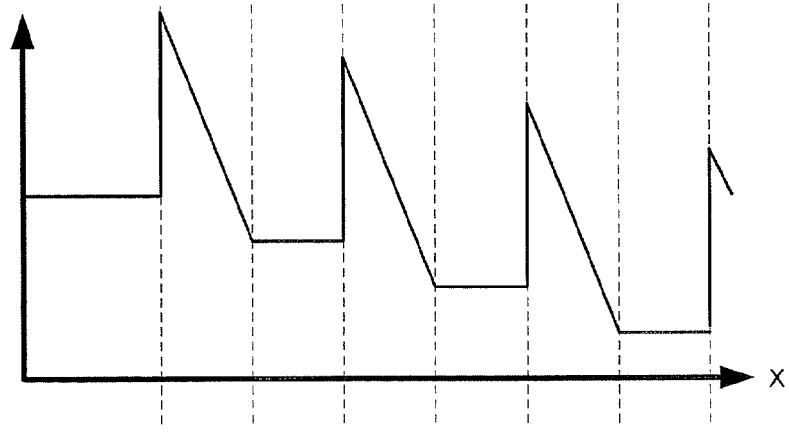
Figure 2:
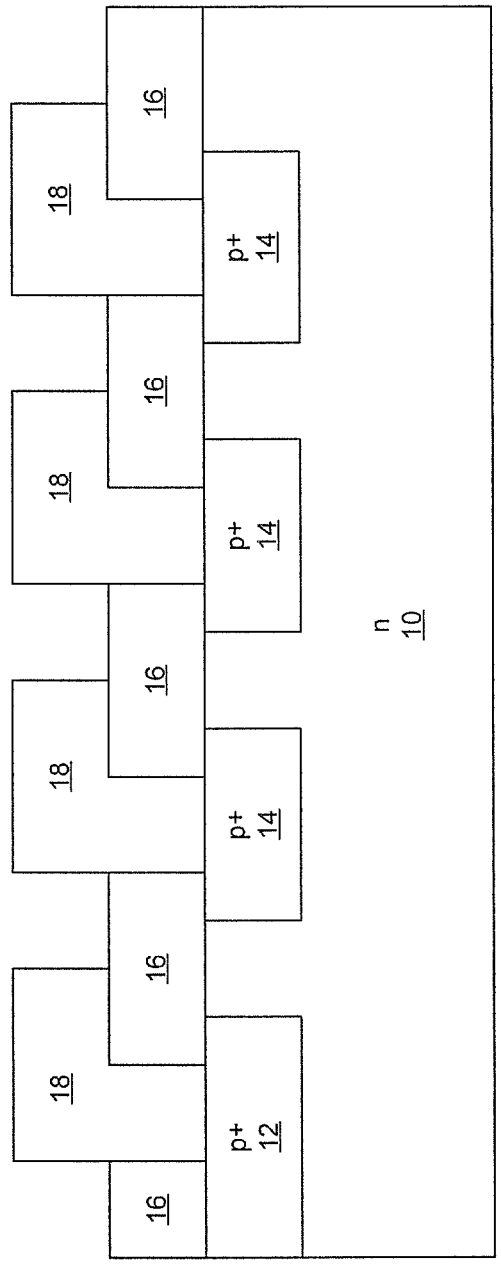
FIG. 2 is a diagram of a conventional MFGR structure with offset field plates.

The invention will be described more fully hereinafter with reference to the accompanying drawings, in which example embodiments of the invention are shown. This invention may, however, be embodied in many different forms and should not be construed as limited to the example embodiments set forth herein. Rather, the disclosed embodiments are provided so that this disclosure will be thorough and complete, and will fully convey the scope of the invention to those skilled in the art. In the drawings, the size and relative sizes of layers and regions may be exaggerated for clarity. Moreover, each embodiment described and illustrated herein includes its complementary conductivity type embodiment as well. Like numbers refer to like elements throughout.

It will be understood that when an element or layer is referred to as being "on," "connected to," "coupled to" or "responsive to" (and/or variants thereof) another element, it can be directly on or directly connected, coupled or responsive to the other element or intervening elements may be present. In contrast, when an element is referred to as being "directly on," "directly connected to," "directly coupled to" or "directly responsive to" (and/or variants thereof) another element, there are no intervening elements present. As used herein, the term "and/or" includes any and all combinations of one or more of the associated listed items and may be abbreviated as "/".

It will be understood that, although the terms first, second, third, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

The terminology used herein is for the purpose of describing particular embodiments only and is not intended to be limiting of the invention. As used herein, the singular forms "a," "an" and "the" are intended to include the plural forms as well, unless the context clearly indicates otherwise. It will be further understood that the terms "comprises" and/or "comprising" (and/or variants thereof), when used in this specification, specify the presence of stated features, integers, steps, operations, elements, and/or components, but do not preclude the presence or addition of one or more other features, integers, steps, operations, elements, components, and/or groups thereof. In contrast, the term "consisting of" (and/or variants thereof) when used in this specification, specifies the stated number of features, integers, steps, operations, elements, and/or components, and precludes additional features, integers, steps, operations, elements, and/or components.

Furthermore, relative terms, such as "lower" or "bottom" and "upper" or "top," may be used herein to describe one element's relationship to another elements as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The exemplary term "lower", can therefore, encompasses both an orientation of "lower" and "upper," depending of the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

Example embodiments of the invention are described herein with reference to cross-section illustrations that are schematic illustrations of idealized embodiments (and intermediate structures) of the invention. As such, variations from the shapes of the illustrations as a result, for example, of manufacturing techniques and/or tolerances, may be expected. Thus, the disclosed example embodiments of the invention should not be construed as limited to the particular shapes of regions illustrated herein unless expressly so defined herein, but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the invention, unless expressly so defined herein.

Unless otherwise defined, all terms (including technical and scientific terms) used herein have the same meaning as commonly understood by one of ordinary skill in the art to which the present invention belongs. It will be further understood that terms, such as those defined in commonly used dictionaries, should be interpreted as having a meaning that is consistent with their meaning in the context of the relevant art and the present application, and will not be interpreted in an idealized or overly formal sense unless expressly so defined herein.

As is described in more detail below, embodiments of the present invention may provide improved edge termination of semiconductor devices, such as P—N, Schottky, PiN or other such semiconductor devices. Particular embodiments of the present invention provide edge termination for silicon carbide (SiC) devices. For example, embodiments of the present invention may be utilized as edge termination for SiC Schottky diodes, junction barrier Schottky (JBS) diodes, PiN diodes, thyristors, transistors, or other such SiC devices without departing from the scope of the present invention.

In particular, some embodiments of the present invention provide an improved edge termination for high voltage silicon carbide devices using double guard ring termination ("double GR termination") as will be discussed in detail below with respect to FIGS. 3 through 15. Commonly assigned U.S. Pat. No. 7,026,650 to Ryu et al. (hereinafter "the '650 patent), which has been incorporated herein by reference above, discusses robust guard ring termination ("robust GR termination") used in conjuction with SiC power devices. As discussed therein, a surface charge compensation layer, such as a thin p-type layer, is provided in addition to the multiple floating guard rings. The guard ring termination structure discussed in the '650 patent has shown higher blocking capabilities than the conventional guard ring termination, including junction termination extension (JTE). However, the maximum breakdown voltage may still be less than the value predicted in theory.

Accordingly, some embodiments of the present invention provide double guard ring (DGR) termination structures for highly doped and lightly doped implantations, respectively. In particular, the highly doped portion of the guard ring may be achieved by Aluminum (Al) implants, while the lightly doped portion of the guard ring may be achieved by Boron (B) implant. Providing both highly doped and lightly doped implants in accordance with some embodiments of the present invention may provide a doping gradient from the main junction to the termination edge such that the electrical field can be further reduced in devices according to some embodiments of the present invention. In other words, the mean doping concentration of the guard ring is greater at the main junction of the device and decreases toward the periphery of the device. The doping gradient in accordance with some embodiments of the present invention is especially useful for Boron in SiC, which can diffuse during a high temperature activation process. Details with respect to some embodiments of the present invention will be discussed further herein with respect to FIGS. 3 through 15.

Figure 3:
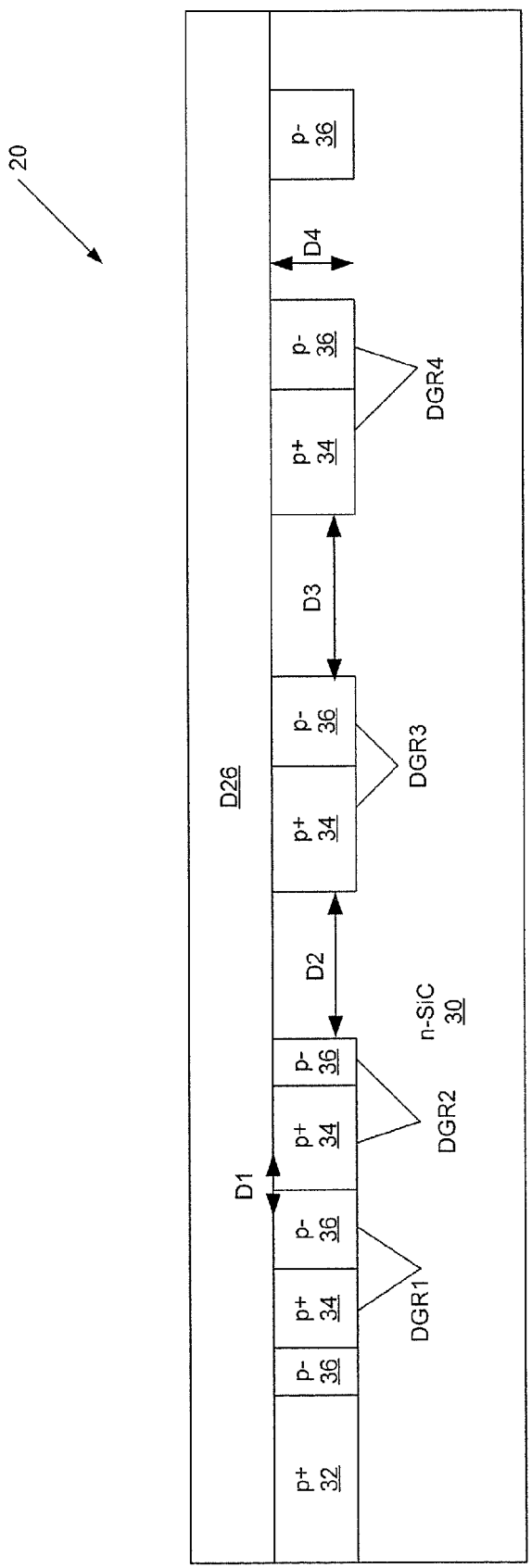
FIG. 3 is a cross section of an edge termination structure according to some embodiments of the present invention.

Referring now to FIG. 3, a cross section of a silicon carbide semiconductor device 20 illustrating some embodiments of the present invention will be discussed. As illustrated in FIG. 3, a silicon carbide layer 30, such as a lightly doped n-type silicon carbide layer, has formed therein a main junction 32, for example, of p-type silicon carbide, and a plurality of double guard rings DGR1, DGR2, DGR3 and DGR4, such as p-type silicon carbide floating guard rings, in accordance with some embodiments of the present invention. Although four double guard rings DGR1, DGR2, DGR3 and DGR4 are illustrated in FIG. 3, embodiments of the present invention are not limited to this configuration. Any number of double guard rings may be included without departing from the scope of the present invention.

As further illustrated in FIG. 3, an insulating layer 26, such as an oxide layer, is provided on the silicon carbide layer 30. The insulating layer 26 may be a deposited or grown oxide and may be fabricated utilizing techniques known to those of skill in the art. In particular embodiments of the present invention, the insulating layer 26 may be an oxide, such as $SiO_2$, a nitride, such as $Si_3N_4$, an oxide-nitride-oxide structure and/or an oxynitride or organic films such as a polyimide layer.

As is further illustrated in FIG. 3, the double guard rings DGR1, DGR2, DGR3 and DGR4 each include first and second portions 34 and 36, respectively. In some embodiments of the present invention, the first and second portions 34 and 36 of the double guard rings DGR1, DGR2, DGR3 and DGR4 may be p-type silicon carbide. Although the first and second guard rings DGR1 and DGR2 are illustrated as having a distance D1 between them equal to zero, embodiments of the present invention are not limited to this configuration. The distance between the first and second guard rings DGR1 and DGR2 can be greater than zero without departing from the scope of the present application. Further illustrated are the distances between the second DGR2 and third guard DGR3 rings and the third DGR3 and fourth DGR4 guard rings D2 and D3, respectively. The distances D1, D2 and D3 may all be different distances without departing from the scope of the present invention.

For the structure illustrated in FIG. 3 where p-type silicon carbide double guard rings are provided in an n-type silicon carbide layer, the dose charge (concentration×depth=dose) of the highly doped portion ($p^+$) 34 of the double guard rings DGR1, DGR2, DGR3 and DGR4 may be from about $5.0 \times 10^{18}$ to about $1.0 \times 10^{20}$ $cm^{-3}$. The lightly doped portion ($p^-$) 36 may be from about $5.0 \times 10^{16}$ to about $5.0 \times 10^{17}$ $cm^{-3}$. As used herein, "$n^+$" or "$p^+$" refer to regions that are defined by higher carrier concentrations than are present in adjacent or other regions of the same or another layer or substrate. The highly doped portions 34 and the lightly doped portions 36 of the double guard rings DGR1, DGR2, DGR3 and DGR4 may extend a distance D4 from about 0.3 to about 0.8 μm into the silicon carbide layer 30. Although FIG. 1 illustrates that the highly doped portion 34 and the lightly doped portion 36 extend into the substrate a same distance D4, embodiments of the present invention are not limited to this configuration. Alternative embodiments will be discussed further below with respect to FIG. 13.

The highly doped 34 and/or lightly doped 36 portions of the double guard rings DGR1, DGR2, DGR3 and DGR4 may have higher doping concentrations closer to the main junction 32 of the device 20 and lower doping concentrations at the periphery of the device 20. In some embodiments of the present invention, Aluminum ions are implanted to achieve the highly doped portions 34 and Boron ions are implanted to achieve the lightly doped portions 36. Providing the lightly doped portions 36 in a second guard ring adjacent the highly doped guard ring allows a doping gradient from the main junction 32 to the termination edge to be provided, especially for Boron in SiC which can diffuse during high temperature activation process. Thus, the electric field may be further reduced in accordance with some embodiments of the present invention.

The oxide-semiconductor interface is expected to have from about $1.0 \times 10^{12}$ to about $2.0 \times 10^{12}$ cm$^{-3}$ of positive charge. The surface of the surface low does portions 36 of the double guard rings DGR1, DGR2, DGR3 and DGR4 will, typically, be depleted by the positive surface charges, and the negative charges in the depletion region low does portions 36 of the double guard rings DGR1, DGR2, DGR3 and DGR4 will reduce the E-field lines originating from the oxide interface charges, and possibly neutralize the negative effects of the positive interface charges.

As discussed above, in some embodiments of the present invention, the double guard rings 34/36 may be uniformly spaced, non-uniformly spaced or combinations of uniformly and non-uniformly spaced. In other words, the lengths of D1, D2, D3 and the like may vary and may not be constant. Additionally, in certain embodiments of the present invention, from about 1 to about 100 guard rings 34/36 may be provided. The guard rings 34/36 may extend a distance of from about 10 μm to about 1000 μm from the main junction of the device.

In fabricating devices according to certain embodiments of the present invention, the lightly doped portions 36 may be formed before or after formation of the highly doped portions 34. Both the highly doped portion 34 and the lightly doped portion 36 may be provided by, for example, ion implantation, or other techniques known to those of skill in the art. Alternatively, the lightly doped portion 34 or the highly doped portion 36 may be an epitaxially grown layer of SiC or deposited layer of SiC that is formed on the layer 30 and, in the case of the regions, patterned to provide the desired surface charge compensation regions and/or layers. In such case, the guard rings may be formed prior to formation of the SiC layer or after formation of the SiC layer.

While embodiments of the present invention have been illustrated with reference to a P—N main junction, as will be appreciated by those of skill in the art in light of the present disclosure, edge termination techniques according to embodiments of the present invention may be utilized with other devices and/or junction types, such as Schottky junctions.

As discussed above with respect to FIG. 3, some embodiments of the present invention provide a novel edge termination structure including double guard rings for the high and low implant doses to further reduce the electrical field. In particular, as discussed above, some embodiments of the present invention provide a gradient of the lightly doped portion 34 of the guard ring, which can further improve the blocking capability of power devices. Furthermore, in accordance with some embodiments of the present invention, the lightly doped portion 34 may have a wide range of tolerance in processing such as misalignment, opening definition, and the like. Double guard ring termination structures according to some embodiments of the present invention may be processed using existing processes and, therefore, may not increase the processing steps and difficulty of processing these devices. A higher blocking capability provided by devices according to some embodiments of the present invention may result in the improvement in other parameters of power devices, such as reducing on-resistance by a thinner drift layer. A thinner drift layer may reduce the power device die size further to achieve a higher die yield.

Figure 4C:
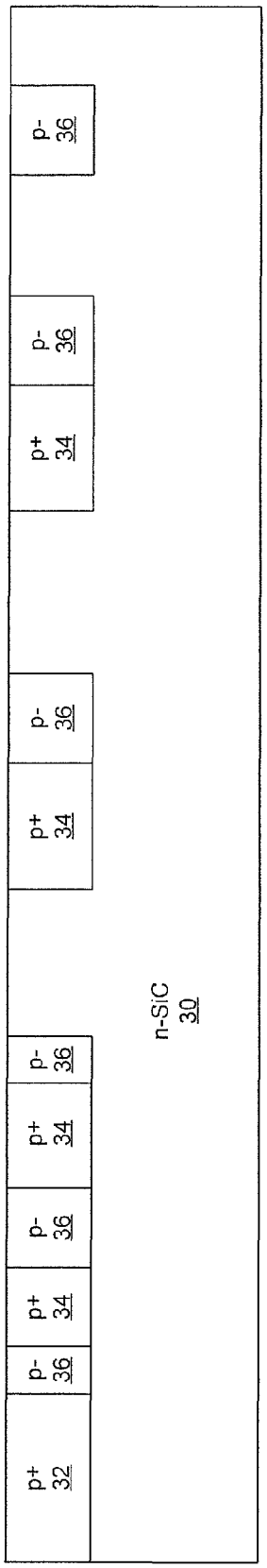

Methods of fabricating double guard ring edge termination structures according to some embodiments of the present invention will now be discussed with respect to FIGS. 4A through 4D. As seen in FIG. 4A, a silicon carbide layer 30 has formed in it a junction 32 and spaced apart highly doped portions 34 of the double guard ring structure. Such regions may be formed, for example, by ion implantation into a silicon carbide substrate and/or epitaxial layer. For example, aluminum ions having a doping concentration of from about $5.0 \times 10^{18}$ to about $1.0 \times 10^{20}$ cm$^{-3}$ may be implanted into the silicon carbide layer 30 to provide the highly doped portions 34 illustrated in FIG. 4A.

Referring now to FIG. 4B, a mask layer 100 may be formed and patterned on the silicon carbide layer 30 and may correspond to the junction 32 and highly doped portions of the guard ring 34. The mask layer 100 may be made of conventional mask materials and may, for example, be patterned using conventional photolithography or other such techniques known to those of skill in the art. The mask layer 100 opens windows adjacent the junction 32 and the highly doped portions of the guard rings 34.

Figure 4D:
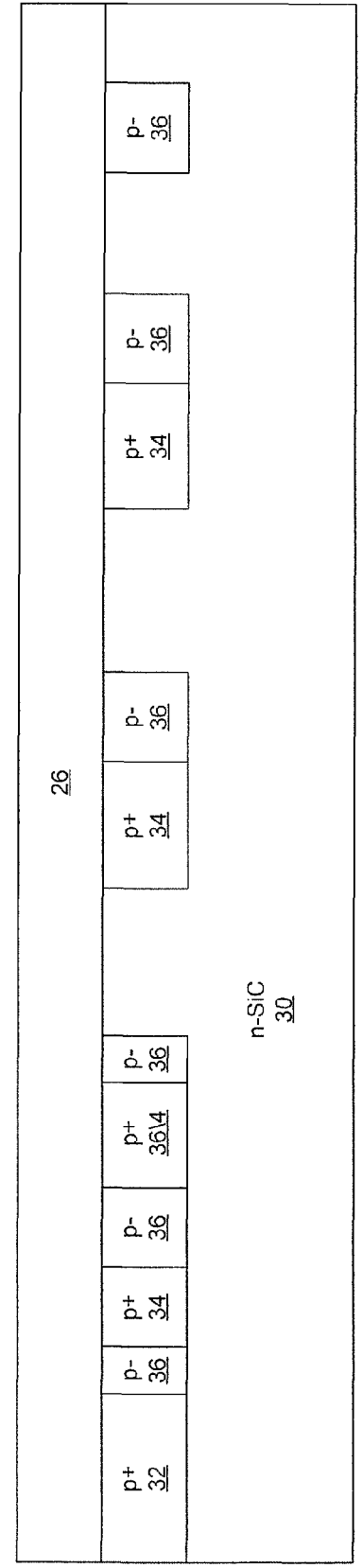

As illustrated in FIG. 4C, the lightly doped portions 36 of the guard rings may be formed through ion implantation using the mask layer 100 as an ion implantation mask. For example, boron ions having a doping concentration of from about $5.0 \times 10^{16}$ to about $5.0 \times 10^{17}$ cm$^{-3}$ may be implanted into the silicon carbide layer 30 to provide the lightly doped portions 34 illustrated in FIG. 4C. The mask layer 100 may then be removed and the insulating layer 26 may be formed on the resulting structure as illustrated in FIG. 4D. The insulating layer 26 may, for example, be formed by thermal oxidation and/or depositing an oxide on the resulting structure.

While embodiments of the present invention have been described with reference to particular operations in fabrication, particular mask patterns and the like, as will be appreciated by one of skill in the art in light of the present disclosure, other operations, sequences of operations, mask patterns and the likes may be utilized while still benefiting from the teachings of the present invention. For example, a different sequence of implantation of guard rings and surface charge compensation regions may be provided. Furthermore, the particular operations in fabrication of the device may depend on the device being fabricated. Thus, for example, the fabrication of a transistor may have different fabrication steps than the fabrication of a diode. Accordingly, embodiments of the present invention should not be construed as limited to particular operations in fabrication but may encompass and fabrication operations that provide edge termination structures as described herein.

Figure 5:
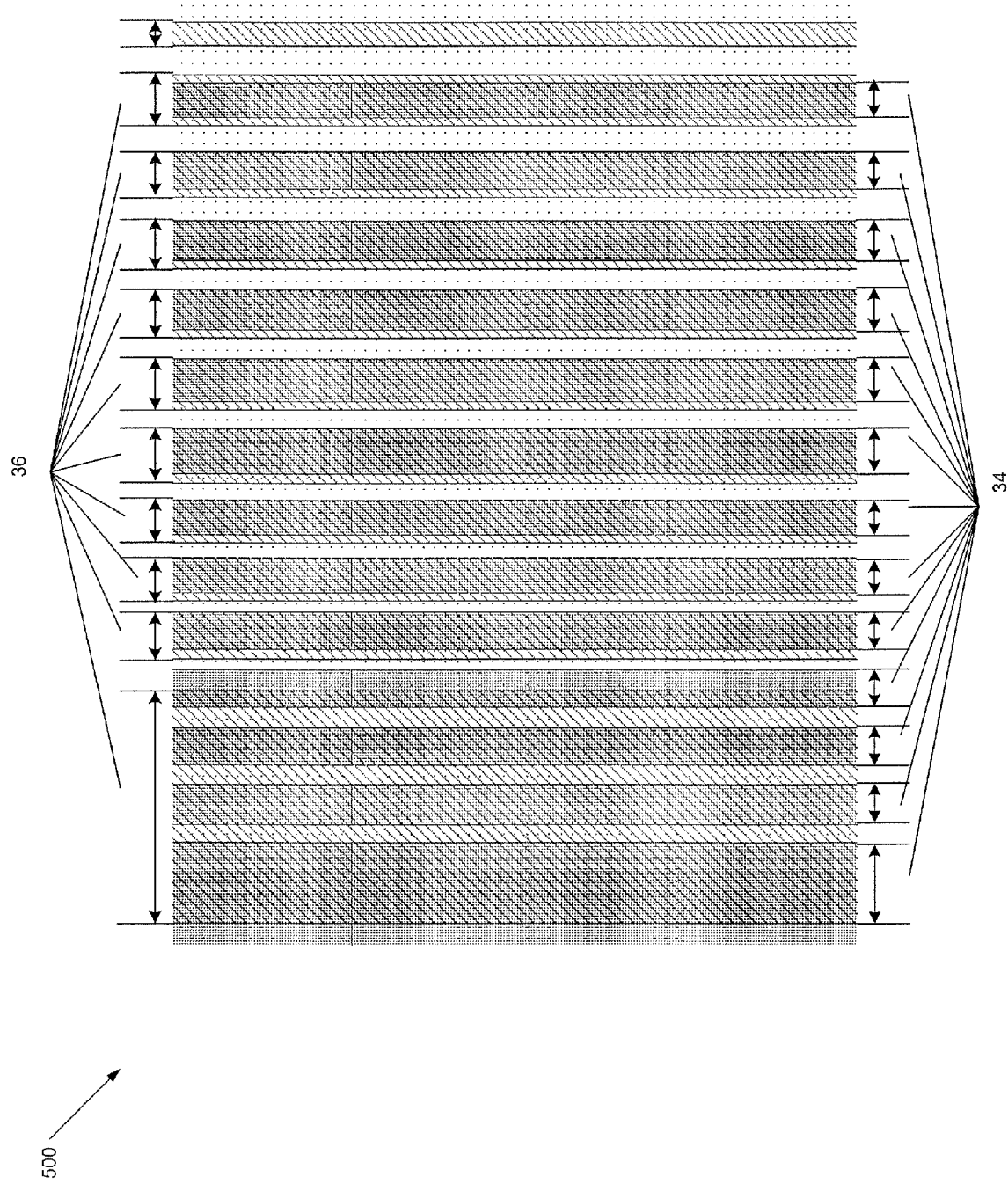
FIG. 5 is a plan view of a double guard ring mask for ion implantation according to some embodiments of the present invention.

Referring now to FIG. 5, a mask used to form double guard ring termination structures in accordance with some embodiments of the present invention will be discussed. As illustrated in FIG. 5, the mask 500 has been patterned to form the lightly doped portion 34, for example, boron, of the double guard rings and the highly doped portion 36, for example, aluminum, of the double guard rings. The portions of the mask 500 used to implant the highly doped portions 36 are set out in FIG. 5. Furthermore, the portions of the mask 500 used to implant the lightly doped portions 34 are set out in FIG. 5. Accordingly, double guard ring termination in accordance with some embodiments of the present invention may allow the dose of the lightly doped guard ring (B) to be gradually reduced from the main junction of the device to the periphery using one time implantation.

Figure 6:
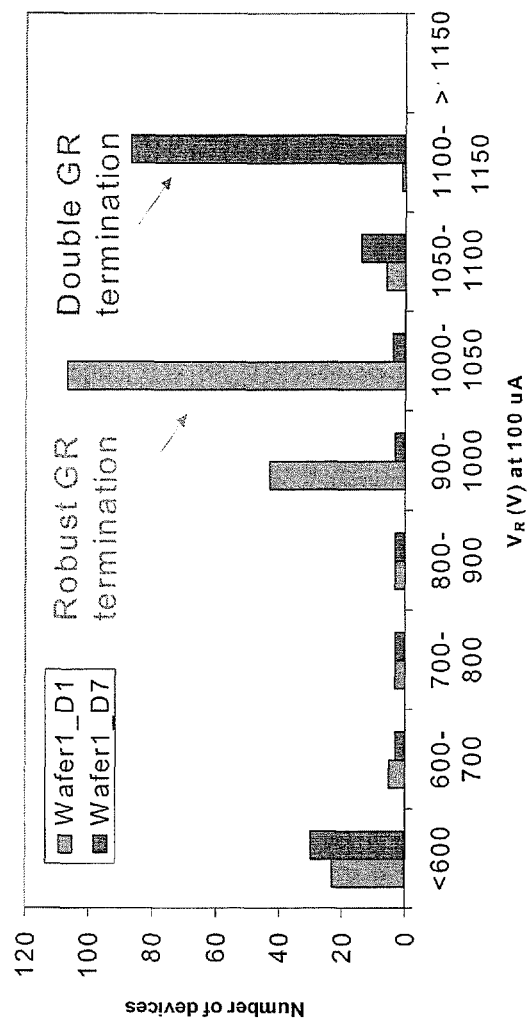
FIG. 6 is a blocking histogram for diodes with robust guard ring termination ("robust GR termination") and double guard ring termination ("double GR termination") according to some embodiments of the present invention.

Referring now to FIG. 6, a blocking histogram for diodes with robust guard ring termination and double guard ring termination according to some embodiments of the present invention will be discussed. As illustrated by the histogram, a blocking voltage of about 130 V higher was achieved using the double guard ring termination structure in accordance with some embodiments of the present invention.

Figure 7:
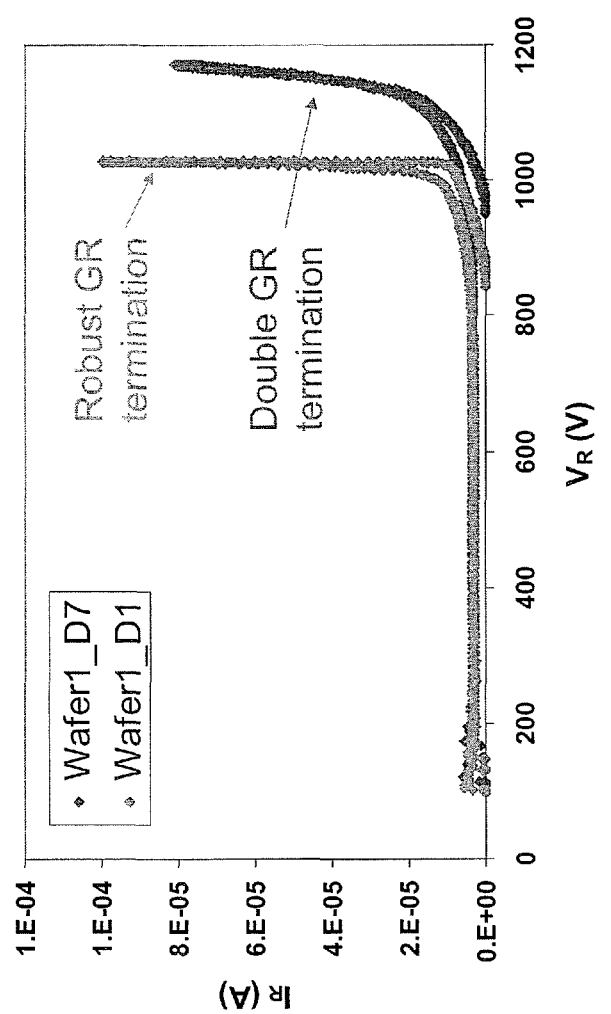
FIG. 7 is a graph illustrating representative reverse IV curves for diodes with robust guard ring termination and double guard ring termination according to some embodiments of the present invention.
Figure 8:
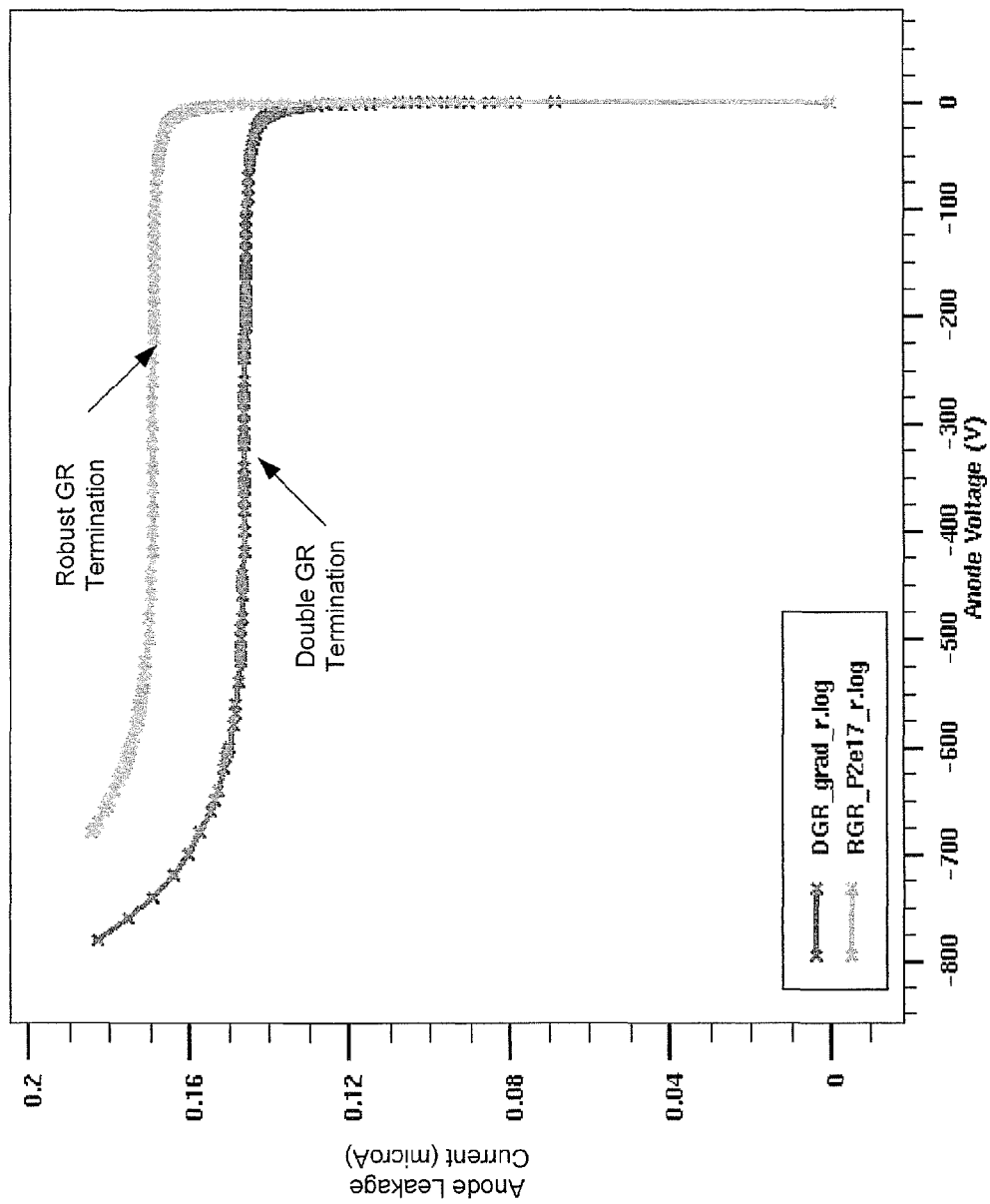
FIG. 8 is a graph illustrating simulations of SiC JBS diode blocking characteristics for diodes with robust guard ring termination and double guard ring termination according to some embodiments of the present invention.

FIG. 7 is a graph illustrating representative reverse IV curves for diodes with robust guard ring termination and double guard ring termination according to some embodiments of the present invention. FIG. 8 is a graph illustrating simulations of SiC JBS diode blocking characteristics for diodes with robust guard ring termination and double guard ring termination according to some embodiments of the present invention. The devices were fabricated using the same wafer.

Figure 10:
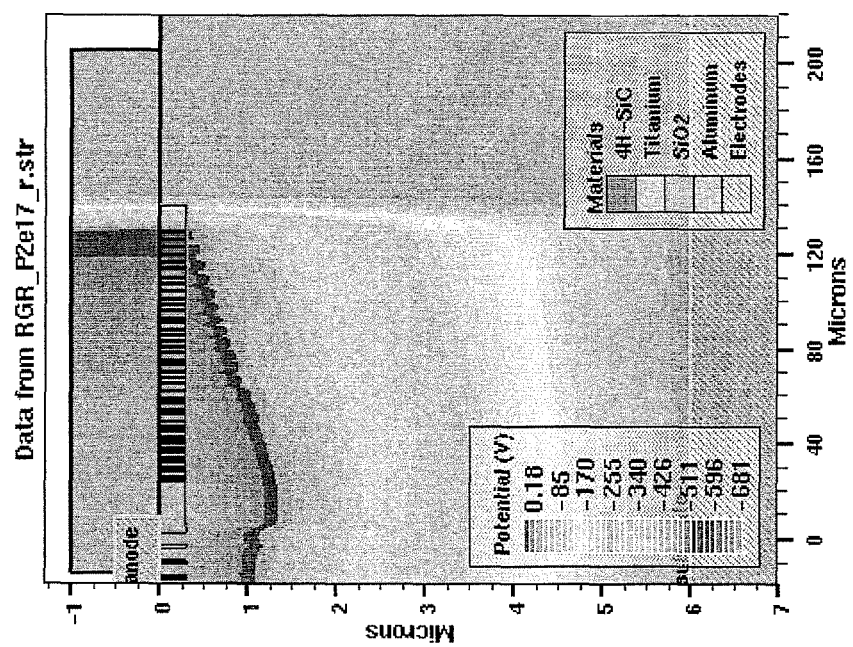
FIGS. 9 and 10 are graphs illustrating potential distribution of JBS with double guard ring termination and robust guard ring termination at 680V, respectively, according to some embodiments of the present invention.
Figure 9:
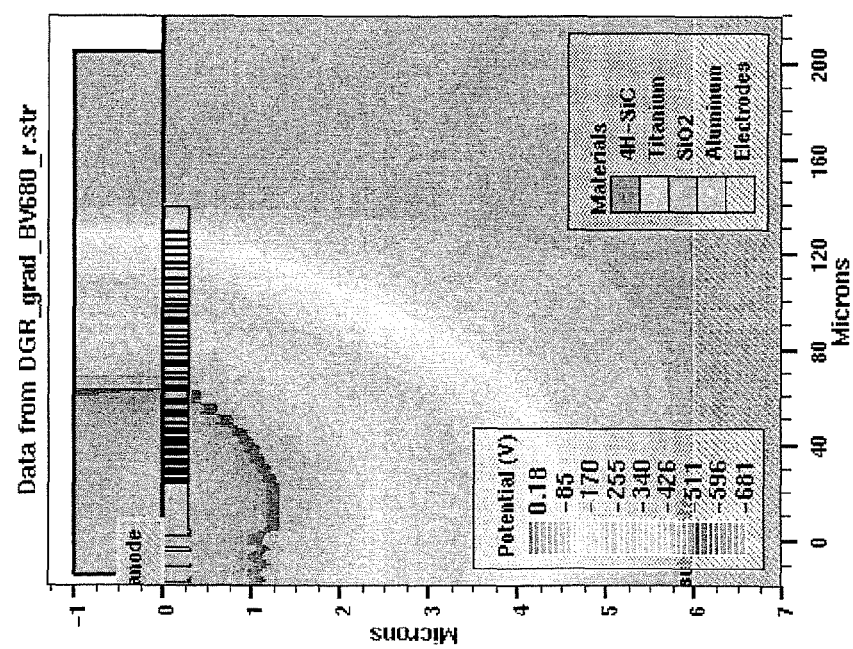
Figure 11:
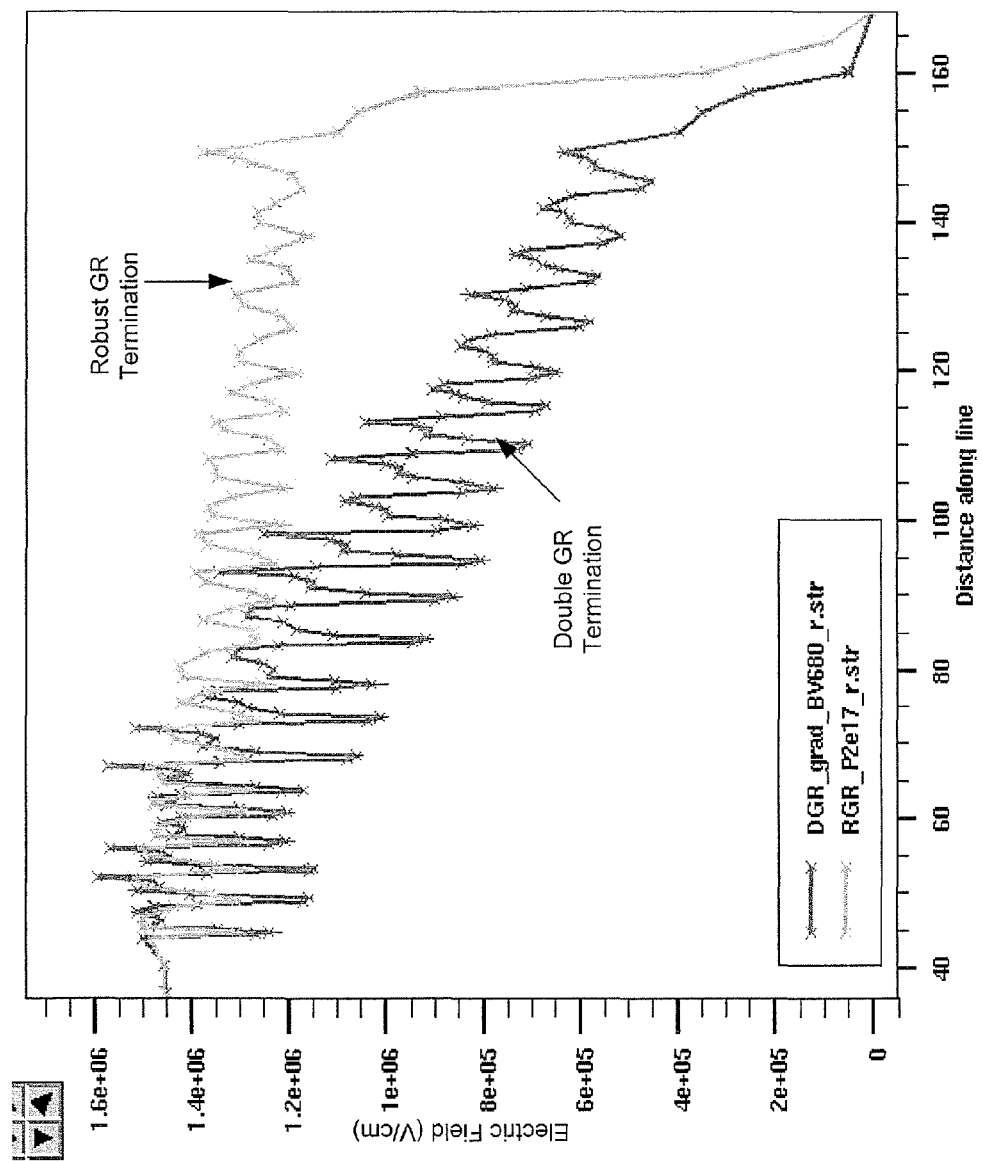
FIGS. 11 and 12 are graphs illustrating electrical field distribution comparisons underneath termination junctions, and at the $SiO_2$/SiC interface, respectively, according to some embodiments of the present invention.
Figure 12:
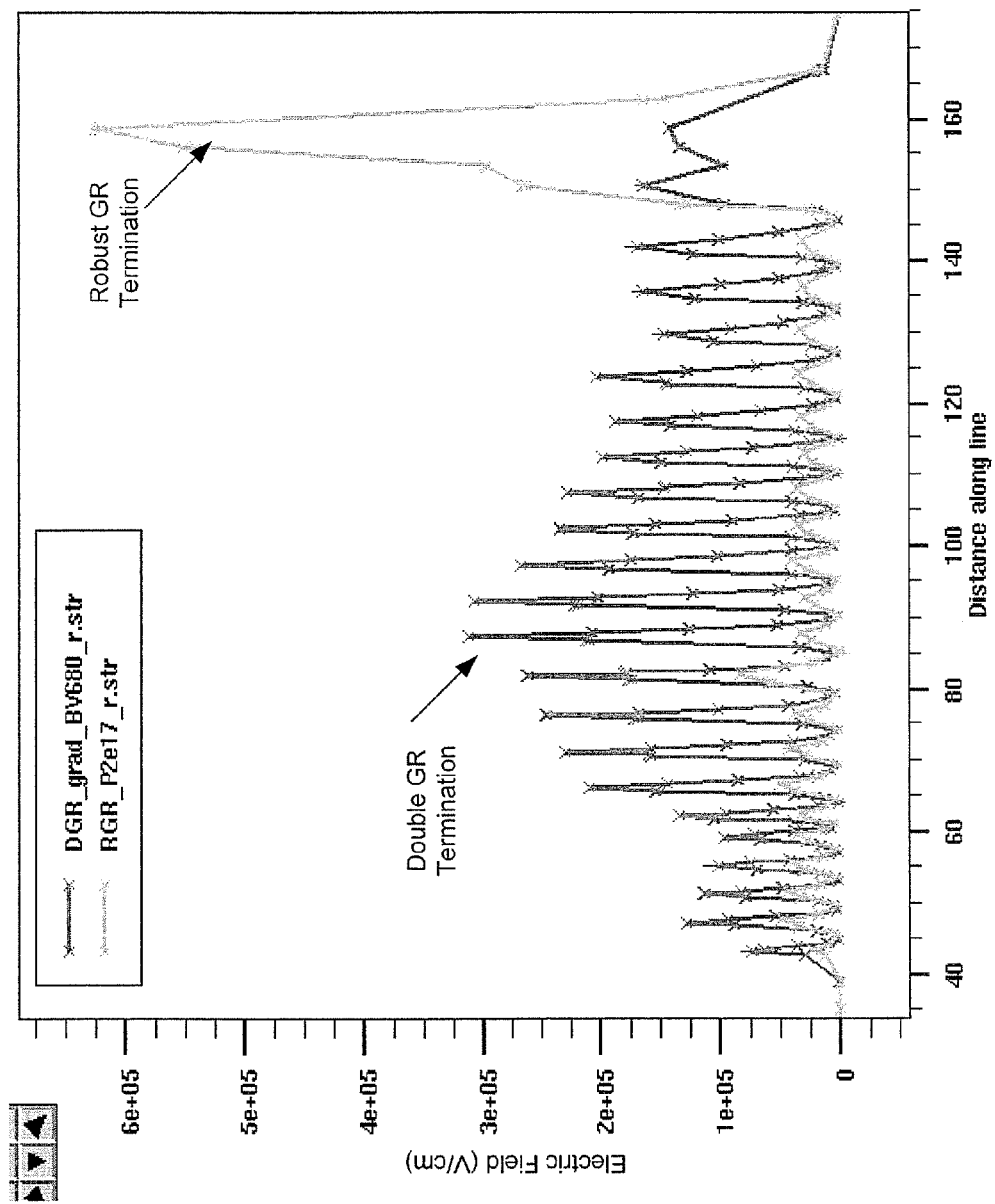

FIGS. 9 and 10 are graphs illustrating potential distribution of JBS with double guard ring termination and robust guard ring termination at 680V, respectively, according to some embodiments of the present invention. FIGS. 11 and 12 are graphs illustrating electrical field distribution comparisons underneath termination junctions, and at the SiO$_2$/SiC interface, respectively, according to some embodiments of the present invention. It will be understood that a lower electric field yields a lower leakage current.

Figure 13:
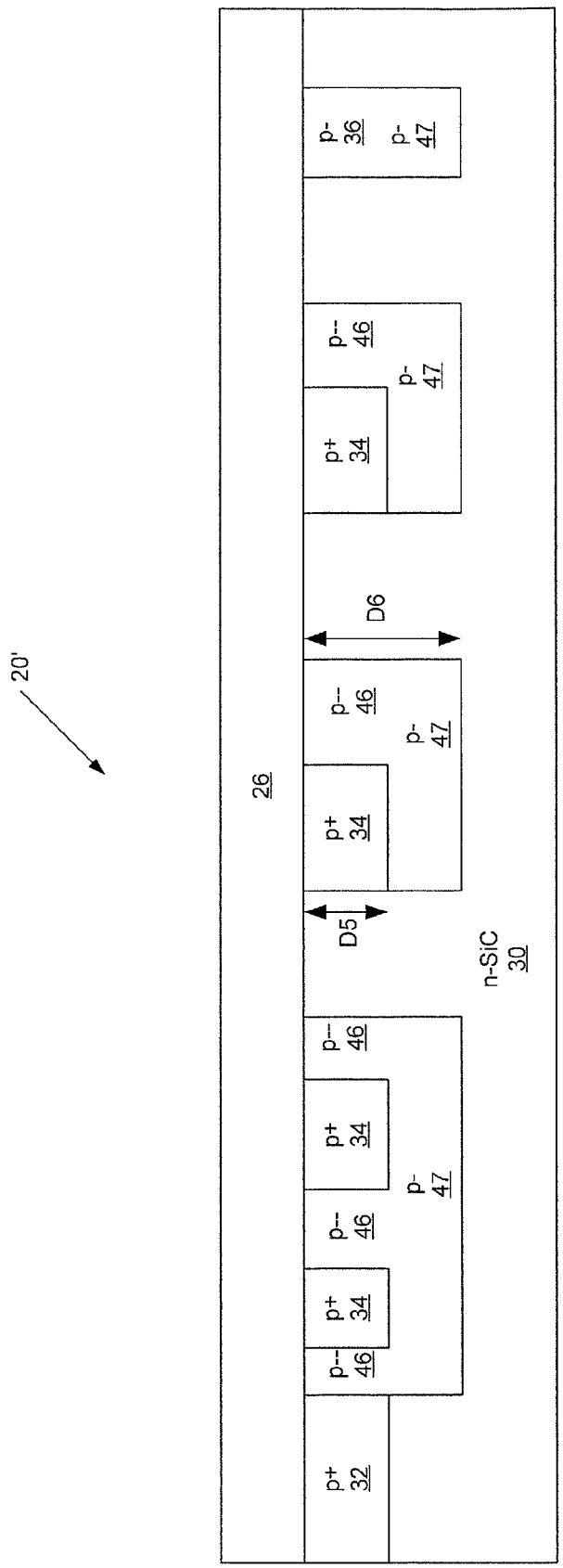
FIG. 13 is a cross section illustrating an edge termination structure according to some embodiments of the present invention.

Referring now to FIG. 13, a cross section illustrating an edge termination structure 20' according to some embodiments of the present invention. Like reference numerals refer to like elements throughout, accordingly details with respect to like numbered elements discussed above with respect to FIG. 3 will not be repeated herein in the interest of brevity. As illustrated in FIG. 13, the lightly doped portion of the double guard ring structure has first and second portions 46 and 47. As illustrated in FIG. 13, the first portion of the lightly doped portion 46 may be a p$^{--}$ layer and may have a doping concentration of about $1.0\times10^{17}$ cm$^{-3}$. The first portion of the lightly doped portion may extend about 0.5 µm into the semiconductor layer 30. Furthermore, the second portion of the lightly doped portion 47 may be a p$^-$ layer and have a doping concentration of about $1.4\times10^{17}$ cm$^{-3}$. The second portion of the lightly dopes portion 47 may extend about 0.8 µm into the semiconductor layer 30 and may extend beneath the highly doped portion 36. Embodiments of the present invention illustrated in FIG. 13 may exhibit improvement in electric field characteristics as illustrated in FIGS. 14 and 15 discussed below.

Figure 14:
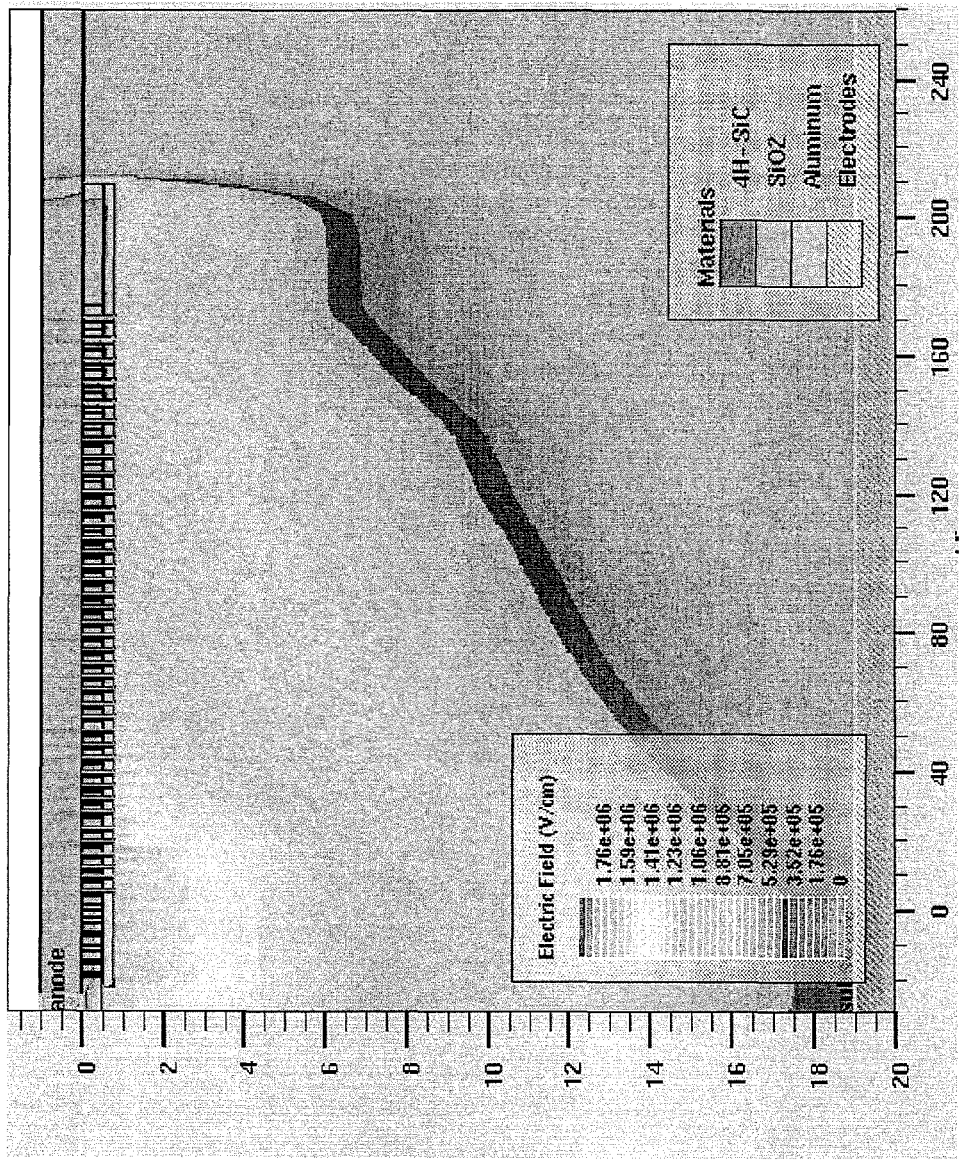
FIG. 14 is a graph illustrating electric field characteristics in accordance with some embodiments of the present invention illustrated in FIG. 13.
Figure 15:
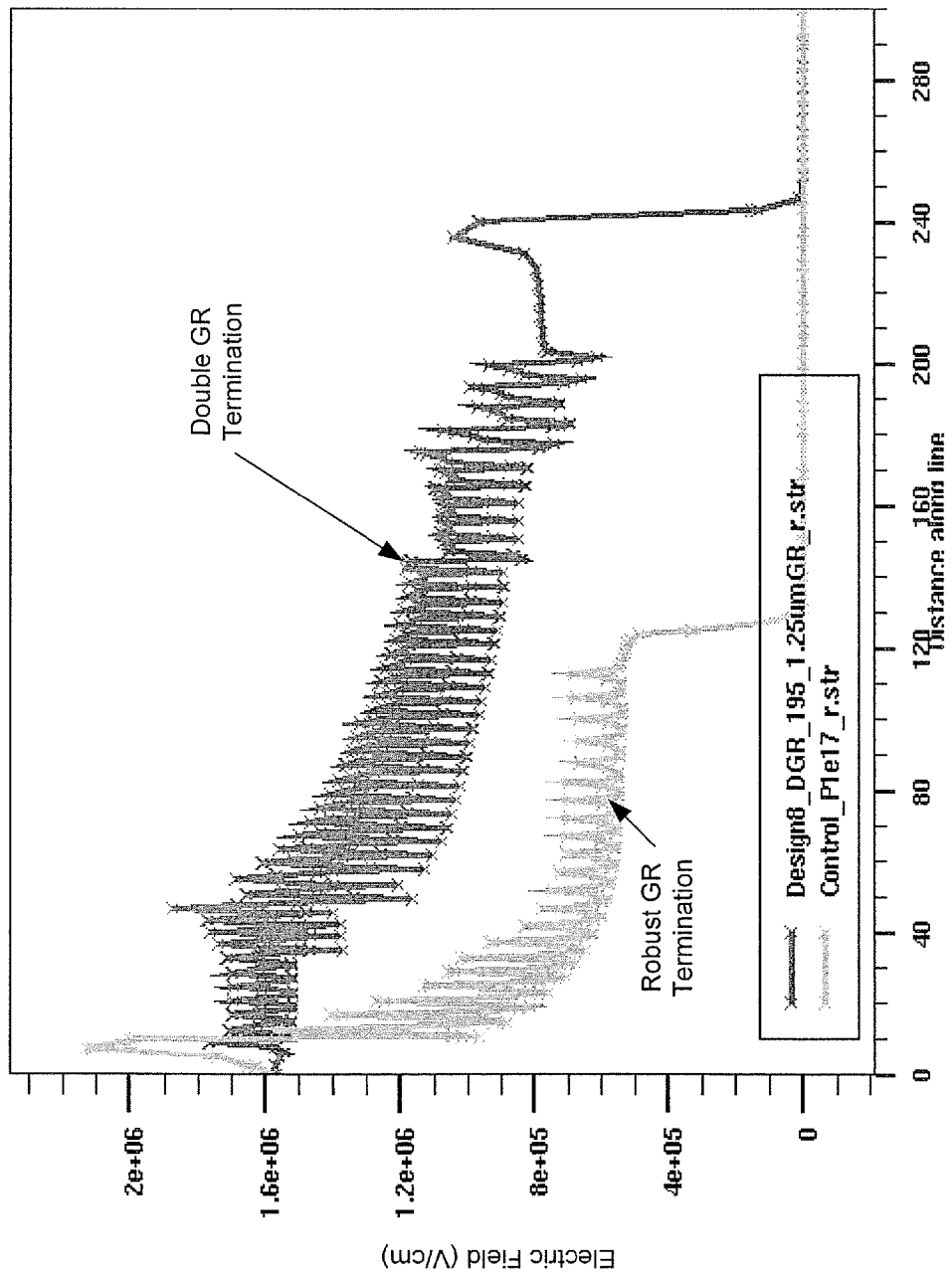
FIG. 15 is a graph illustrating electric field characteristics in accordance with some embodiments of the present invention illustrated in FIG. 13.

FIG. 14 is a graph illustrating electric field characteristics in accordance with some embodiments of the present invention illustrated in FIG. 13. FIG. 15 is a graph illustrating electric field characteristics in accordance with some embodiments of the present invention illustrated in FIG. 13. In particular, FIG. 15 is a graph illustrating robust GR termination and double guard ring termination with a retrograde profile of the second doping concentration.

Although embodiments of the present invention are discussed above primarily with respect to silicon carbide semiconductor devices, embodiments of the present invention are not limited to silicon carbide devices. For example, devices according to some embodiments of the present invention may be silicon (Si), gallium nitride (GaN) or gallium arsenide (GaAs) without departing from the scope of the present invention.

In the drawings and specification, there have been disclosed typical preferred embodiments of the invention and, although specific terms are employed, they are used in a generic and descriptive sense only and not for purposes of limitation, the scope of the invention being set forth in the following claims.

That which is claimed is:

1. An edge termination structure for a semiconductor device, comprising:
a plurality of spaced apart concentric floating guard rings in a silicon carbide semiconductor layer that at least partially surrounds a semiconductor junction in the edge termination structure,
wherein the plurality of spaced apart concentric floating guard rings each have a highly doped portion and a lightly doped portion;
wherein the highly doped portion and the lightly doped portion of each of the plurality of spaced apart concentric floating guard rings have an associated dopant concentration; and
wherein the lightly doped portion of the floating guard rings has at least two portions, a first portion having a first depth no greater than a depth of the highly doped portion of the floating guard rings and having a first doping concentration and a second portion having a second depth greater than the depth of the highly doped portion of the floating guard rings, extending beneath the highly doped portion, having a planar bottom surface and one sidewall that is aligned with a sidewall of the highly doped portion and having a second doping concentration, greater than the first doping concentration.

2. The edge termination structure of claim 1, wherein the semiconductor device comprises a silicon carbide semiconductor device, the semiconductor layer comprises a silicon carbide layer and the semiconductor junction comprises a silicon carbide-based semiconductor junction.

3. The edge termination structure of claim 2, wherein the highly doped portion of each of the plurality of spaced apart concentric floating guard rings extend a first distance into the silicon carbide layer and wherein the lightly doped portion of each of the plurality of spaced apart concentric floating guard rings extend a second distance into the silicon carbide layer.

4. The edge termination structure of claim 3, wherein the first distance and the second distance are the same.

5. The edge termination structure of claim 3, wherein the first distance is less than the second distance.

6. The edge termination structure of claim 5, wherein the first distance is about 0.5 µm and the second distance is about 0.8 µm.

7. The edge termination structure of claim 6, wherein the lightly doped portion of the floating guard rings has a first doping concentration in a portion adjacent the highly doped portion of the floating guard rings and a second doping concentration, greater than the first doping concentration, beneath the highly doped portion of the floating guard rings.

8. The edge termination structure of claim 7, wherein the first doping concentration is about $1.0\times10^{17}$ and the second doping concentration is about $1.4\times10^{17}$.

9. The edge termination structure of claim 2, wherein the highly doped portion of each of the plurality of spaced apart concentric floating guard rings have a dopant concentration of from about $5.0\times10^{18}$ cm$^{-3}$ to about $1.0\times10^{20}$ cm$^{-3}$ and wherein the lightly doped portion of each of the plurality of spaced apart concentric floating guard rings have a dopant concentration of from about $5.0\times10^{16}$ cm$^{-3}$ to about $5.0\times10^{17}$ cm$^{-3}$.

10. The edge termination structure of claim 1, wherein the highly doped portion and the lightly doped portion of the plurality of spaced apart concentric floating guard rings extend a distance of from about 0.3 μm to about 0.8 μm into the silicon carbide layer.

11. The edge termination structure of claim 1, wherein the floating guard rings are one of uniformly spaced, non-uniformly spaced and a combination of uniformly and non-uniformly spaced.

12. The edge termination structure of claim 1, wherein the plurality of spaced apart concentric floating guard rings comprises from about 2 to about 100 guard rings.

13. The edge termination structure of claim 2, wherein the silicon carbide layer is an n-type silicon carbide layer and the plurality of spaced apart concentric floating guard rings are p-type silicon carbide.

14. The edge termination structure of claim 2, wherein the silicon carbide layer is a p-type silicon carbide layer and the plurality of spaced apart concentric floating guard rings are n-type silicon carbide.

15. The edge termination structure of claim 1, wherein the highly doped portion of each of the plurality of spaced apart concentric floating guard rings is doped with Aluminum and wherein the lightly doped portion of each of the plurality of spaced apart concentric floating guard rings is doped with Boron.

16. The edge termination structure of claim 1, wherein the plurality of spaced apart concentric floating guard rings are non-uniformly spaced.

17. The edge termination structure of claim 1, further comprising an oxide insulating layer on the plurality of spaced apart concentric floating guard rings, wherein an oxide-semiconductor interface where the oxide insulating layer and the plurality of spaced apart concentric floating guard rings meet is expected to have from about $1.0\times10^{12}$ to about $2.0\times10^{12}$ cm$^{-3}$ of positive charge.

18. An edge termination structure for a semiconductor device, comprising:
at least two spaced apart concentric floating guard rings in a silicon carbide semiconductor layer, the at least two spaced apart concentric floating guard rings configured to reduce electric field breakdown of the device and each of the at least two spaced apart concentric floating guard rings having a highly doped portion and a lightly doped portion,
wherein the highly doped portion and the lightly doped portion of each of the at least two spaced apart concentric floating guard rings have an associated dopant concentration; and
wherein the lightly doped portion of the floating guard rings has at least two portions, a first portion having a first depth no greater than a depth of the highly doped portion of the floating guard rings and having a first doping concentration and a second portion having a second depth greater than the depth of the highly doped portion of the floating guard rings, extending beneath the highly doped portion, having at least one sidewall that is aligned with a sidewall of the highly doped portion and having a second doping concentration, greater than the first doping concentration.

19. The edge termination structure of claim 18, wherein the at least two spaced apart concentric floating guard rings at least partially surrounds the main semiconductor junction.

20. The edge termination structure of claim 19, wherein the semiconductor device comprises a silicon carbide semiconductor device, the semiconductor layer comprises a silicon carbide layer and the semiconductor junction comprises a silicon carbide-based semiconductor junction.

21. The edge termination structure of claim 20, wherein the highly doped portion of each of the at least two spaced apart concentric floating guard rings extend a first distance into the silicon carbide layer and wherein the lightly doped portion of each of the at least two spaced apart concentric floating guard rings extend a second distance into the silicon carbide layer.

22. The edge termination structure of claim 20, wherein the highly doped portion of each of the at least two spaced apart concentric floating guard rings have a dopant concentration of from about $5.0\times10^{18}$ cm$^{-3}$ to about $1.0\times10^{20}$ cm$^{-3}$ and wherein the lightly doped portion of each of the at least two spaced apart concentric floating guard rings have a dopant concentration of from about $5.0\times10^{16}$ cm$^{-3}$ to about $5.0\times10^{17}$ cm$^{-3}$.

23. The edge termination structure of claim 18, wherein the highly doped portion and the lightly doped portion of the at least two spaced apart concentric floating guard rings extend a distance of from about 0.3 μm to about 0.8 μm into the silicon carbide layer.

24. The edge termination structure of claim 18, wherein the floating guard rings are one of uniformly spaced, non-uniformly spaced and a combination of uniformly and non-uniformly spaced.

25. The edge termination structure of claim 18, wherein the at least two spaced apart concentric floating guard rings comprises from about 2 to about 100 guard rings.

26. The edge termination structure of claim 18, wherein the highly doped portion of each of the at least two spaced apart concentric floating guard rings is doped with Aluminum and wherein the lightly doped portion of each of the at least two spaced apart concentric floating guard rings is doped with Boron.

27. The edge termination structure of claim 18 wherein the at least two spaced apart concentric floating guard rings are non-uniformly spaced.

28. The edge termination structure of claim 18, further comprising an oxide insulating layer on the at least two spaced apart concentric floating guard rings, wherein an oxide-semiconductor interface where the oxide insulating layer and the at least two spaced apart concentric floating guard rings meet is expected to have from about $1.0\times10^{12}$ to about $2.0\times10^{12}$ cm$^{-3}$ of positive charge.

* * * * *